United States Patent
Ahmed

(10) Patent No.: US 7,253,627 B1
(45) Date of Patent: Aug. 7, 2007

(54) METHOD FOR REMOVING NOISE FROM NUCLEAR MAGNETIC RESONANCE SIGNALS AND IMAGES

(76) Inventor: Osama Abdel-Wahhab Ahmed, P.O. Box 857, KFUPM, Dhahran, 31261 (SA)

(*) Notice: Subject to any disclaimer, the term of this patent is extended or adjusted under 35 U.S.C. 154(b) by 0 days.

(21) Appl. No.: 11/488,595

(22) Filed: Jul. 19, 2006

(51) Int. Cl.
*G01V 3/00* (2006.01)

(52) U.S. Cl. ........................ 324/322; 324/307

(58) Field of Classification Search ........ 324/300–322; 600/410–445
See application file for complete search history.

(56) References Cited

U.S. PATENT DOCUMENTS

| | | | |
|---|---|---|---|
| 4,463,375 A | 7/1984 | Macovski | |
| 4,475,084 A | 10/1984 | Moore | |
| 4,709,212 A | 11/1987 | MacFall | |
| 4,728,893 A | 3/1988 | Feinberg | |
| 4,814,710 A | 3/1989 | McKinnon | |
| 5,051,698 A | 9/1991 | Ordidge | |
| 5,113,137 A | 5/1992 | Koizumi | |
| 5,463,342 A | 10/1995 | Guard | |
| 5,517,122 A | 5/1996 | Chen | |
| 5,545,991 A | 8/1996 | Nauerth | |
| 5,587,656 A | 12/1996 | Van Heels-Bergen | |
| 5,615,676 A | 4/1997 | Kohno | |
| 5,655,532 A | 8/1997 | Yasugi | |
| 6,071,494 A * | 6/2000 | Unger ........................ 424/9.4 | |
| 6,078,872 A | 6/2000 | Carson | |
| 6,377,042 B1 | 4/2002 | Menger | |
| 6,486,671 B1 | 11/2002 | King | |
| 6,537,233 B1 * | 3/2003 | Rangayyan et al. ........ 600/586 | |
| 6,600,315 B1 | 7/2003 | Heaton | |
| 7,206,459 B2 * | 4/2007 | Berkner et al. ............. 382/251 |
| 2006/0056520 A1 * | 3/2006 | Comer et al. ............... 375/242 |

FOREIGN PATENT DOCUMENTS

| | | |
|---|---|---|
| DE | 3643577 | 6/1988 |
| EP | 0431216 A1 | 6/1991 |
| JP | 61227424 | 10/1986 |

OTHER PUBLICATIONS

Ahmed, O., "Fast computation of discrete SLTF transform," Proceedings of the 11th IEEE Workshop on Statistical Signal Processing, Orchid Country Club, Singapore, Aug. 2001, pp. 317-320.

Ahmed, O. and Fahmy, M., "NMR signal enhancement via a new time-frequency transform," IEEE Transactions on Medical Imaging, vol. 20, No. 10, Oct. 2001, pp. 1018-1025.

* cited by examiner

*Primary Examiner*—Brij Shrivastav
(74) *Attorney, Agent, or Firm*—Richard C. Litman

(57) ABSTRACT

The method for removing noise from nuclear magnetic resonance signals and images involves removing noise from NMR signals through the application of stable linear time-frequency (SLTF) transforms. According to the method, a noise variance for a particular NMR signal is calculated and the NMR signal is sampled and digitized. A set of analysis samples that vary in the number of samples in frequency is selected so that each member of the set has a compact signal/image representation for at least one component according to the differing component relaxation times of the signal/image. Each member of the set is then processed by the SLTF to determine the transform coefficients, the coefficients are subjected to threshold value criteria to denoise the coefficients, and the inverse SLTF transform is computed for each member of the set to obtain the denoised signal. The member signals are then averaged to obtain the denoised NMR signal.

17 Claims, 6 Drawing Sheets

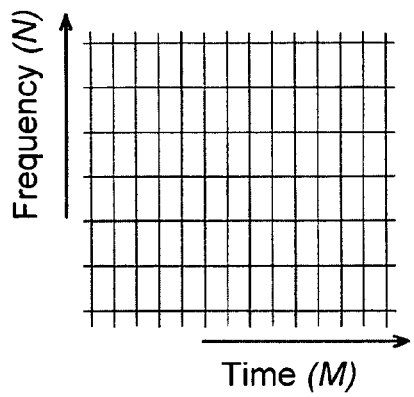
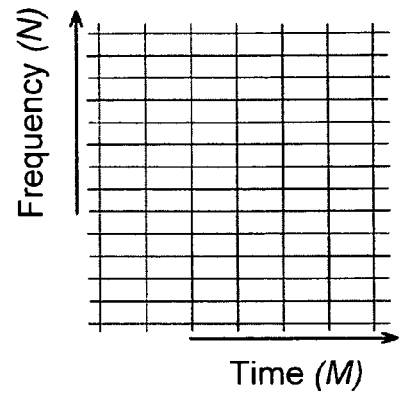
Fig. 1A  Fig. 1B
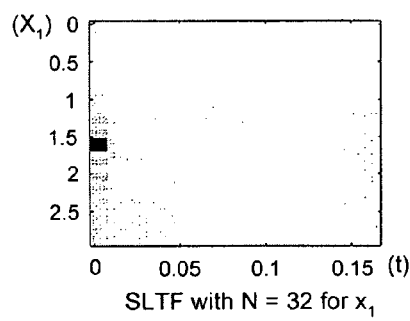
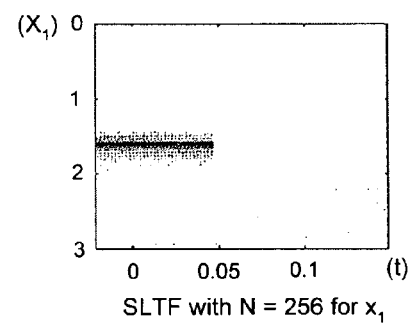
Fig. 2A  Fig. 2B
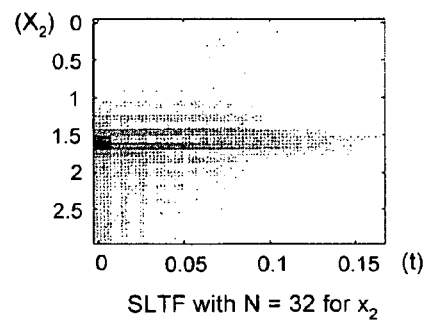
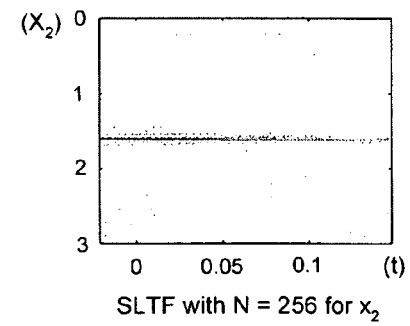
Fig. 2C  Fig. 2D

METHOD FOR REMOVING NOISE FROM NUCLEAR MAGNETIC RESONANCE SIGNALS AND IMAGES

BACKGROUND OF THE INVENTION

1. Field of the Invention

The present invention relates to digital signal processing techniques, noise filters, nuclear magnetic resonance spectroscopy, and nuclear magnetic resonance imaging, and particularly to a method for removing noise from nuclear magnetic resonance signals and images.

2. Description of the Related Art

Nuclear magnetic resonance (NMR) is a potentially useful and effective diagnostic tool in basic research, clinical investigation and disease diagnosis, since it provides both chemical and physiological information regarding the tissue under investigation. NMR is based upon the precession of protons when placed in a magnetic field. The precessional axis lies along the direction of the magnetic field, and the precession occurs with a frequency directly proportional to the strength of the magnetic field, with a proportionality constant unique to each atom, which is called the gyromagnetic ratio.

If an oscillating magnetic field at the precessional frequency is applied in a direction perpendicular to the static field, the protons will precess about the axis of the oscillating field, as well as that of the static field. The oscillating field is generated by a tuned radio-frequency (RF) coil. The magnetic field of the precessing protons induces, in turn, an oscillating voltage in the RF coil, which is detected when the RF field is gated off. This voltage has an exponential decay over time and is generally referred to as the free induction decay (FID).

This voltage is then amplified and demodulated to baseband, similar to a superheterodyne receiver, and digitized using an analog-to-digital converter. The oscillating RF pulse is repeated and the FIDs are added coherently.

In order to factor out the signal's dependence upon the static magnetic field, NMR measurements are often given in a unitless quantity measured in parts per million (ppm), known as the chemical shift, δ, which is the difference between the precession frequency of protons that are part of a particular molecular group and that of protons in a reference compound, divided by the latter; i.e., $$\delta = \frac{f_{sample} - f_{reference}}{f_{reference}} \times 10^6 \, ppm.$$

This particular application of NMR is generally referred to as high-resolution nuclear magnetic resonance spectroscopy, and is widely used in the pharmaceutical and chemical industries.

NMR has been extended to the in vivo study of human anatomy. This has been made possible through practical methods for exciting signals from limited volumes and for generating spatial maps of this signal. The protons of the water molecules of the patient's tissue are the source of the signal in magnetic resonance imaging (MRI). Signal strength is modified by properties of each proton's microenvironment, such as its mobility and the local homogeneity of the magnetic field. The spatial information needed to form images from magnetic resonance is obtained by placing magnetic field gradient coils on the inside of the magnet. These coils create additional magnetic fields that vary in strength as a linear function of distance along the three spatial axes.

Thus, the resonant frequencies of the water protons within the patient's body are spatially encoded. The contrast in MRI images arises from difference in the number of protons in a given volume and in their relaxation times (the time taken for the magnetization of the sample to return to equilibrium after the RF pulse is gated off), which are related to the molecular environment of the protons.

The signal-to-noise ratio (SNR) of NMR signals and images is typically the limiting factor for higher data interpretation. Signal/image averaging is typically used to increase the SNR, but this method often results in a substantial increase in the acquisition time, which may not be tolerable in many situations, particularly for unstable biological compounds where long replications are not feasible. Further, a longer time is not desirable with regard to patient comfort, as well as avoidance of motion artifacts in medical MRI usage. Thus, any reduction in acquisition time without compromising the SNR is valuable in terms of decreasing the high cost of the NMR machine time.

Typically, NMR signal/image denoising is performed by either denoising algorithms based on singular value decomposition (SVD), or denoising via thresholding in time-frequency (TF) or time-scale (TS) domains. The TS domain is also known as the "wavelet" domain.

SVD based algorithms are commonly found in NMR denoising schemes. One such algorithm, the Cadzow algorithm, is based upon the following principle: a noiseless time-domain signal including Q exponentially decaying sinusoids can be identified by a Hankel matrix of rank Q. The measurement from NMR is often of full rank because it is inevitable that random noises have been added. Thus, the goal of denoising is to retrieve as much information as possible about the noiseless Hankel matrix from the observed matrix. The truncated SVD produces the most optimal low rank approximation.

However, this truncated SVD of the observed matrix is generally no longer a Hankel matrix. One method of retrieving a Hankel low rank approximation is to alternate projections between the manifold of rank-Q matrices and the space of Hankel matrices. Such a method may remove any corrupting noise, measurement distortion or theoretical mismatch present in the given data set.

Using TF and TS analysis in NMR denoising is a relatively new methodology. The procedure exploits the fact that TF and TS transforms map white noise in the signal domain to white noise in the transform domain. Thus, although signal energy becomes more concentrated into fewer coefficients in the transform domain, noise energy does not. This important principle enables the separation of signal from noise as follows: (1) transform the noisy signal into a new domain; (2) retain only the coefficients whose magnitudes are above a certain threshold related to the known or estimated noise standard deviation; and (3) perform the synthesis transform on the retained coefficients to obtain the noise-reduced signal.

The transform is chosen according to its ability to represent the NMR signal/image in a small number of coefficients, which depends on the characteristics of both the NMR signal/image and the transform. For example, if the NMR signal/image spans 75% of the transform coefficients, then 25% of the noise could be removed through proper filtering. The retained coefficients, however, still contain approximately 75% of the noise in addition to the desired signal/image.

One of several common transforms used in NMR denoising is the wavelet transform, which has become a popular tool in MRI denoising applications. The wavelet transform localizes the signal/image in both frequency (wave number) and time (position) simultaneously.

In an article co-authored by the present inventor and published in the *IEEE Transactions on Medical Imaging*, 20(10) pp. 1018-1025 (October 2001), it is suggested that stable linear time-frequency ($SLTF_N$) transforms (described in further detail below, with particular reference to equation 1) show a more compact NMR signal/image representation than wavelet transforms and, hence, superior NMR denoising results with minimal desired signal/image distortion. With regard to NMR signal/image denoising, the $SLTF_N$ transform provides more optimal results than other TF transforms. The SLTF is a linear TF transform. Thus, it is relatively easy to compute the inverse transform. This is in contrast to bilinear distributions where difficulties are encountered in retrieving the signal from the TF-domain.

Further, there is no cross-term interference in the SLTF transform such as that encountered in the bilinear distributions. In addition, $SLTF_N$ is a critically-sampled transform, which exceeds over-sampled transforms in ease and effectiveness of signal retrieval from the transformed domain after denoising. Compared to other critically-sampled TF transforms, SLTF has two major advantages: high numerical stability and excellent localization of the biorthogonal function. In addition, a fast algorithm to calculate the SLTF and inverse transforms (described in an article authored by the present inventor appearing in the *Proceedings of the 11th IEEE Workshop on Statistical Signal Processing*, August 2001, pp. 317-320) may be utilized, which is linearly proportional to the signal/image size.

Several thresholding techniques have been developed, such as "hard thresholding" where one retains only the coefficients whose magnitudes are above a threshold proportional to the known or estimated noise power, "soft thresholding", and "global thresholding."

None of the above inventions, taken either singly or in combination, is seen to describe the instant invention as claimed. Thus, a method for removing noise from nuclear magnetic resonance signals and images solving the aforementioned problems is desired.

SUMMARY OF THE INVENTION

The method for removing noise from nuclear magnetic resonance signals and images involves removing noise from NMR signals through the application of stable linear time-frequency (SLTF) transforms. According to the method, a noise variance for a particular NMR signal is calculated and the NMR signal is sampled and digitized. A set of analysis samples that vary in the number of samples in frequency is selected so that each member of the set has a compact signal/image representation for at least one component according to the differing component relaxation times of the signal/image. Each member of the set is then processed by the SLTF to determine the transform coefficients, the coefficients are subjected to threshold value criteria to denoise the coefficients, and the inverse SLTF transform is computed for each member of the set to obtain the denoised signal. The member signals are then averaged to obtain the denoised NMR signal.

The method may be carried out by a software program stored on a computer readable medium and executing in main memory of a general purpose computer under direction of the microprocessor, or may be carried out by a microcontroller, a digital signal processor circuit, or an Application Specific Integrated Circuit (ASIC) programmed or configured for the purpose of carrying out the method.

These and other features of the present invention will become readily apparent upon further review of the following specification and drawings.

BRIEF DESCRIPTION OF THE DRAWINGS

FIG. 1A is a diagram illustrating a tiling scheme in a time-frequency chart having a high sampling rate in frequency, showing the effect of sampling rate on time-frequency resolution in a method for removing noise from nuclear magnetic resonance signals and images according to the present invention.

FIG. 1B is a diagram illustrating a tiling scheme in a time-frequency chart having a low sampling rate in frequency, further showing the effect of sampling rate on time-frequency resolution in a method for removing noise from nuclear magnetic resonance signals and images according to the present invention.

FIG. 2A is a plot of bandwidth vs. relaxation time for a first NMR component in a first SLTF domain having a low sampling rate.

FIG. 2B is a plot of bandwidth vs. relaxation time for the NMR component of FIG. 2A in a second SLTF domain having a high sampling rate.

FIG. 2C is a plot of bandwidth vs. relaxation time for a second NMR component in a first SLTF domain having a low sampling rate.

FIG. 2D is a plot of bandwidth vs. relaxation time for the NMR component of FIG. 2C in a second SLTF domain having a high sampling rate.

Similar reference characters denote corresponding features consistently throughout the attached drawings.

DETAILED DESCRIPTION OF THE PREFERRED EMBODIMENT

Figure 3:
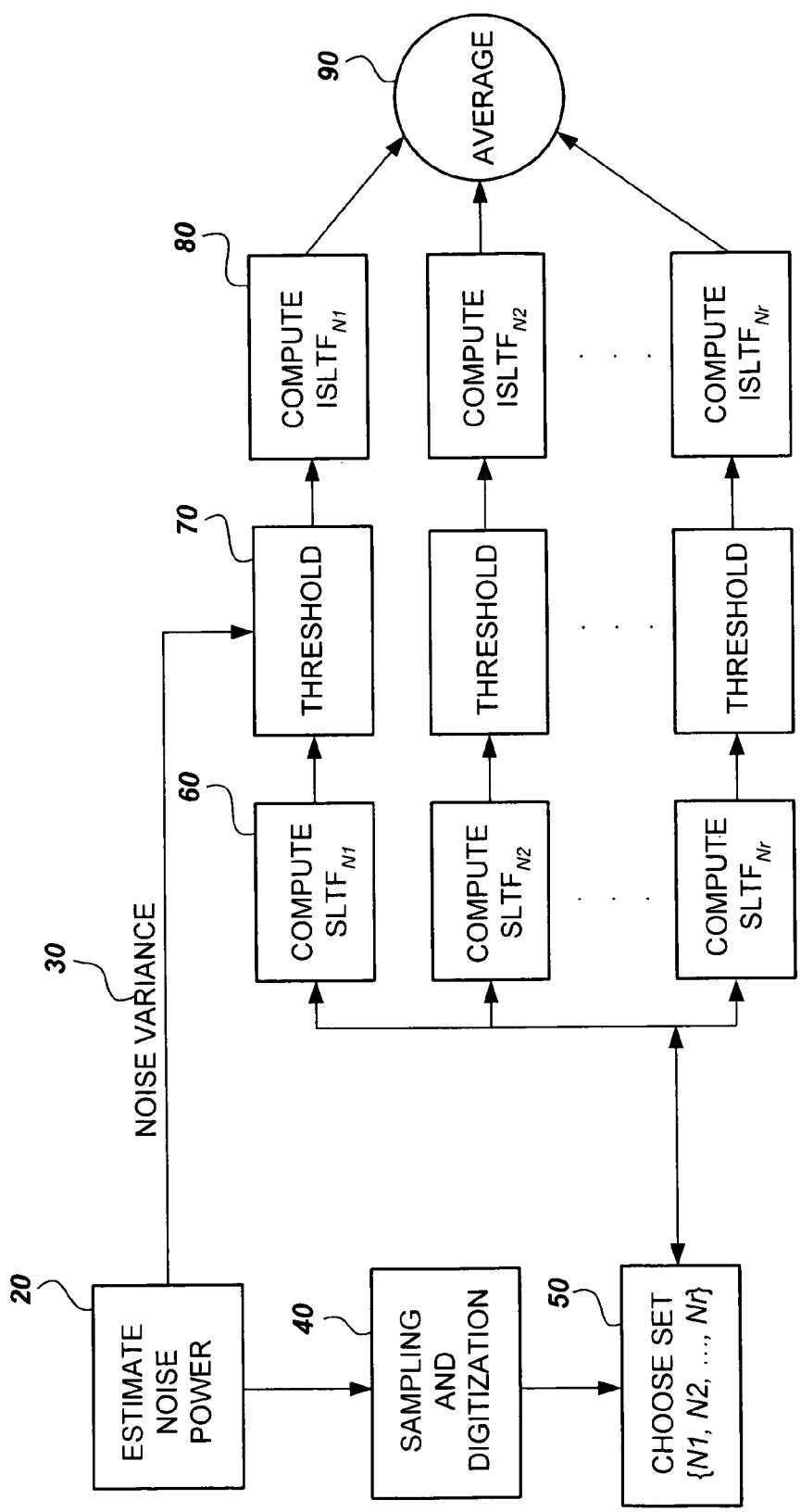
FIG. 3 is a block diagram illustrating the steps of a method for removing noise from nuclear magnetic resonance signals and images according to the present invention.

Referring to FIG. 3, a flow chart diagram representing the steps in a method for removing noise from NMR signals and images is shown. At block 20, the NMR signal or image (both and NMR spectroscopy signal and an MRI image signal ma be referred to generally as an "NMR signal" in the present application) is first processed to estimate the noise variance. An example of such processing would include providing a relatively large recording time for at least one sample. The noise variance σ would then be estimated by calculating the power of the last data points, which are entirely noise.

At block 40, the NMR signal/image is next sampled and digitized. At block 50, a set $N=\{N_1, N_2, \ldots, N_r\}$, of r suitable values of N is then determined according to the time span, the sampling period, etc. The stable linear time-frequency (SLTF) transform is specified by its number of analysis samples in frequency, N, which controls the time and frequency resolutions in the time-frequency (TF) domain, as shown in FIGS. 1A and 1B. FIGS. 1A and 1B illustrate the effect of the choice on N on the tiling of the TF plane. In FIGS. 1A and 1B, each cell represents a single TF atom (sampling period). High N produces short-time atoms (represented by the tiling of FIG. 1A), which are suitable for signals which have fast varying characteristics, but which have low frequency resolution.

Low N produces long-time atoms (represented by FIG. 1B), which are suitable for signals that have slowly varying characteristics. Frequency spreading may occur when long-time atoms are used for fast varying signals and when short-time atoms are used for slowly varying signals. Thus, each choice of N produces one SLTF transform (SLTF$_N$) that is better suited for a particular signal type.

The following steps 60, 70 and 80 are repeated for the r values of N, i.e., for each member or element of the set N. At step 60, an SLTF transform for the noisy NMR signal/image is computed. The SLTF transform is a stable, linear, critically-sampled TF transform, which is defined for a finite extent ($0 \leq k \leq K$) discrete signal x(k) by:

$$a_{m,n} = \sum_{k=0}^{K-1} x(k)\gamma_m^*(k) c\sin(k, n)_N \quad (1)$$

for m=0, ..., M−1 and n=0, ..., N−1, where M and N are the number of analysis samples in time and frequency, respectively, $a_{m,n}$ are the transform coefficients, c sin(z) is a function which represents cos(z) for even m and sin(z) for odd m, and γ(k) is the biorthogonal function to the discrete Gaussian window function:

$$h(k) = \exp\left(-\frac{\pi}{2N^2}\left(k - \frac{N-1}{2}\right)^2\right). \quad (2)$$

At step 70, a thresholding technique is used to denoise the SLTF coefficients. An example of such a thresholding technique would be the use of hard a thresholding technique where all transform coefficients whose energies are lower than a certain threshold value are set to zero. The threshold value t is chosen to be proportional to the noise variance or noise standard deviation σ; i.e., t=cσ; where c is a constant. It should be noted that the estimated noise variance is passed from block 20 to block 70, represented in the flow chart diagram by 30.

A fixed threshold value is taken for all transforms providing that the SLTF transforms possess the energy preservation property. The threshold value is chosen to be t=gσ$\sqrt{2\log K}$, where 0<g<1. The factor g is introduced to ensure that in the worst case where one NMR component loses its compactness during any transformation, a minimal part of this component is filtered out.

At step 80, the denoised coefficients are used to convert back to the time/position domain through the use of an inverse SLTF transform (ISLTF), which is given by:

$$x(k) = \sum_{m=0}^{M-1} \sum_{n=0}^{N-1} a_{m,n} h(k - mN) c\sin\frac{\pi\left(k + \frac{1}{2}\right)\left(n + \frac{1}{2}\right)}{N}. \quad (3)$$

At block 90, the r signals corresponding to each element of set N are averaged to produce the final denoised signal.

As shown in FIGS. 2A-2D, the compactness (and hence the thresholding process) of NMR components varies with N with respect to the component relaxation time. FIGS. 2A-2D illustrate two NMR components, $$x_1(k) = \exp\left(-\frac{t_k}{3} + j^{3000\pi t_k + 55°}\right)$$

and $$x_2(k) = \exp\left(-\frac{t_k}{60} + j^{3000\pi t_k + 55°}\right),$$

in two different SLTF domains, namely, SLTF$_{32}$ and SLTF$_{256}$, respectively (FIGS. 2A and 2B show signal $x_1(k)$ in the SLTF$_{32}$ and SLTF$_{256}$ domains, respectively; FIGS. 2C and 2D show signal $x_2(k)$ in the SLTF$_{32}$ and SLTF$_{256}$ domains, respectively). The number of coefficients whose energy is greater than 1% of the total energy is 13 and 62 for the SLTF$_{32}$ and SLTF$_{256}$ domains, respectively, for $x_1$ and 182 and 46 for $x_2$. Thus, $x_1$ has a more compact representation in the SLTF$_{32}$ domain than in the SLTF$_{256}$ domain, and $x_2$ is more compact in the SLTF$_{256}$ domain than in the SLTF$_{32}$ domain.

Since NMR signals and images are usually composed of differing components with different relaxation times, projecting the signal again into another SLTF$_N$ domain with a different N redistributes both the signal and the noise in such a way that some NMR components will be more compact (i.e., the energy of the NMR component will be contained in fewer coefficients, while the neighboring coefficients will have less energy, which will be removed by filtering). The remaining NMR components will be less compact; i.e., the neighboring coefficients will have more energy and will not be affected by filtering, providing that the threshold value is chosen to be sufficiently low to pass these coefficients.

In the method of the present invention, the noisy NMR signal or image is projected (and denoised) into a set of SLTF$_N$ transforms with different N simultaneously. This set is chosen so that the desired signal/image remains compact in all domains and the noise portion, which is inseparable from the desired signal/image in one domain, is separable in the other. The resulting denoised signals/images will each have different residual noises, which have partially differing characteristics. Averaging these noises (step 90) causes partial cancellation of the noise. The averaging process maintains the integrity of the desired signals/images and decreases the effect of erroneous signal or image cut-off, which may occur during the transform thresholding.

Figure 4:
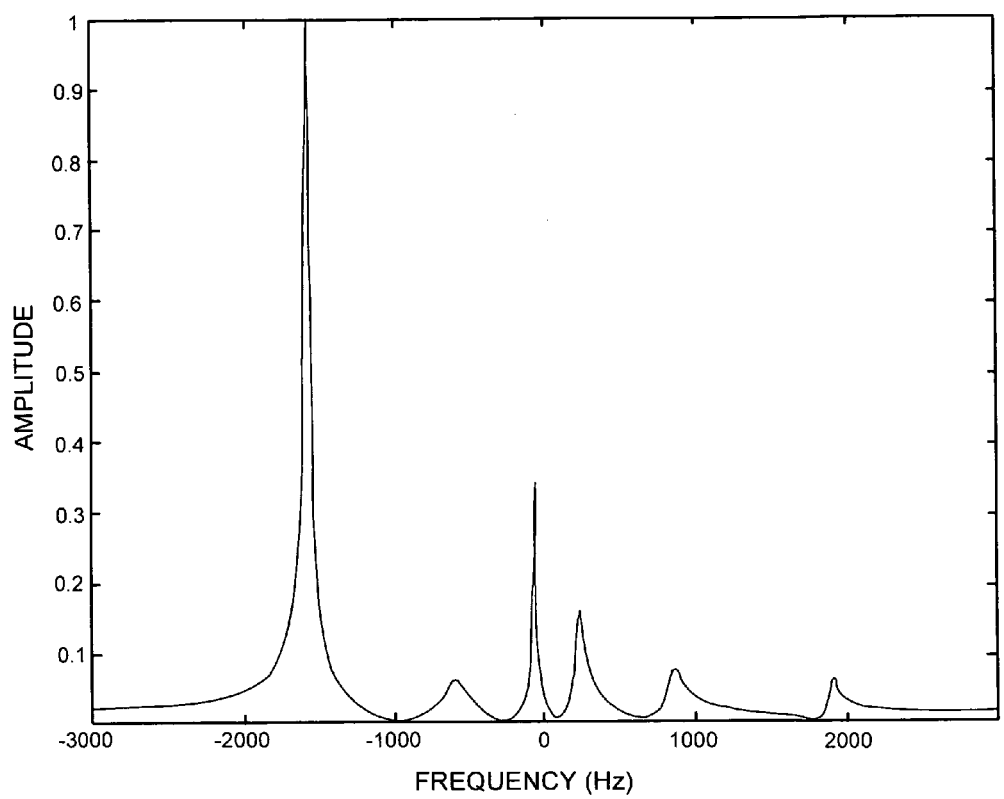
FIG. 4 shows the spectrum of a noise-free phosphorous Free Induction Decay (FID) signal.
Figure 5:
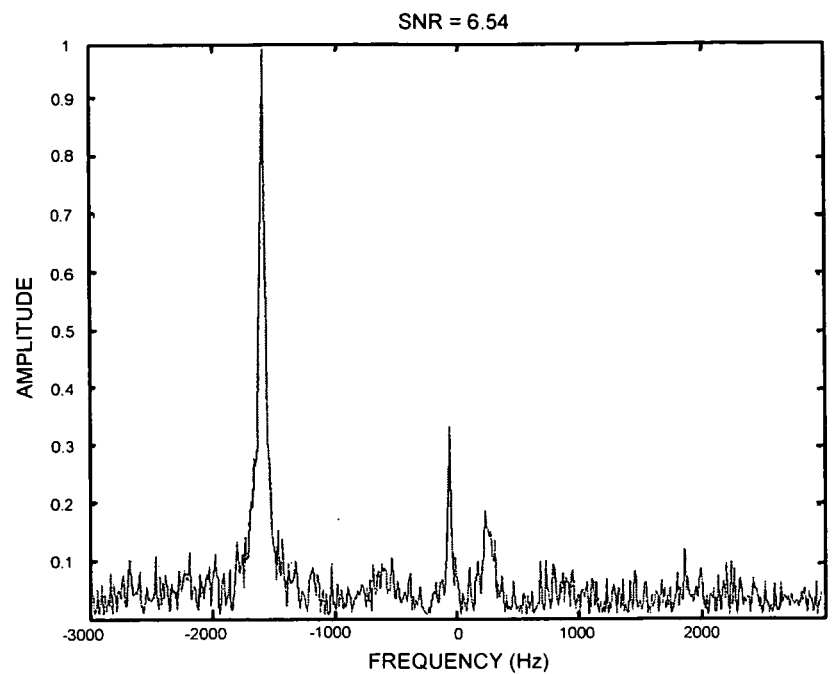
FIG. 5 shows the spectrum of a noisy phosphorous FID signal with five components being distorted by noise.

FIGS. 4 and 5 illustrate the spectrum of a free induction decay of a phosphorous NMR signal x(t), first without noise, and then with noise, respectively. This signal is 512 points with a sampling period of $\Delta_t$=166.2 μs. Since the NMR sequence is time varying, the SNR is defined as the signal energy divided by the energy of the noise in the observation period. The SNR is equal to 6.54 dB.

Figure 6:
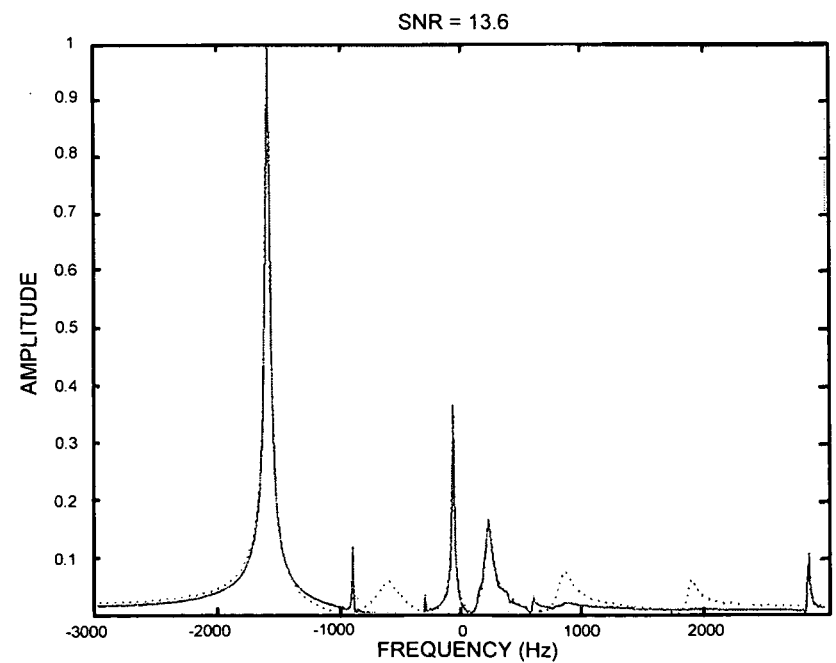
FIG. 6 shows the spectrum of FIG. 5 denoised utilizing the Cadzow algorithm according to the prior art.
Figure 8:
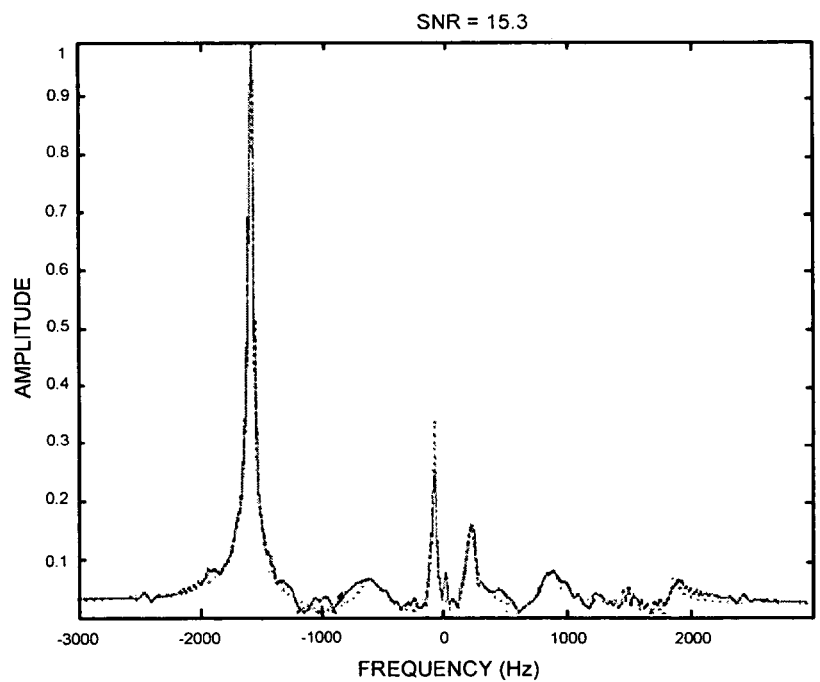
FIG. 8 shows the spectrum of FIG. 5 denoised utilizing the method for removing noise from NMR signals and images according to the present invention.

In order to denoise the signal using the method of the present invention, the values of N={16, 32, 64} and g=0.64 are selected. The spectrum of the resulting denoised signal is shown in FIG. 8. The six peaks are identifiable in the denoised spectrum and the SNR is increased to 15.3 dB. For purposes of comparison, denoising the same signal using the Cadzow algorithm increases the SNR to 13.6 dB, with the denoised spectrum being shown in FIG. 6. It should be noted that the SNR gain difference between the method of the present invention and the Cadzow algorithm is not as appreciable as the spectrum difference. The Cadzow denoised spectrum has erroneous representations of the smallest three components.

Figure 7:
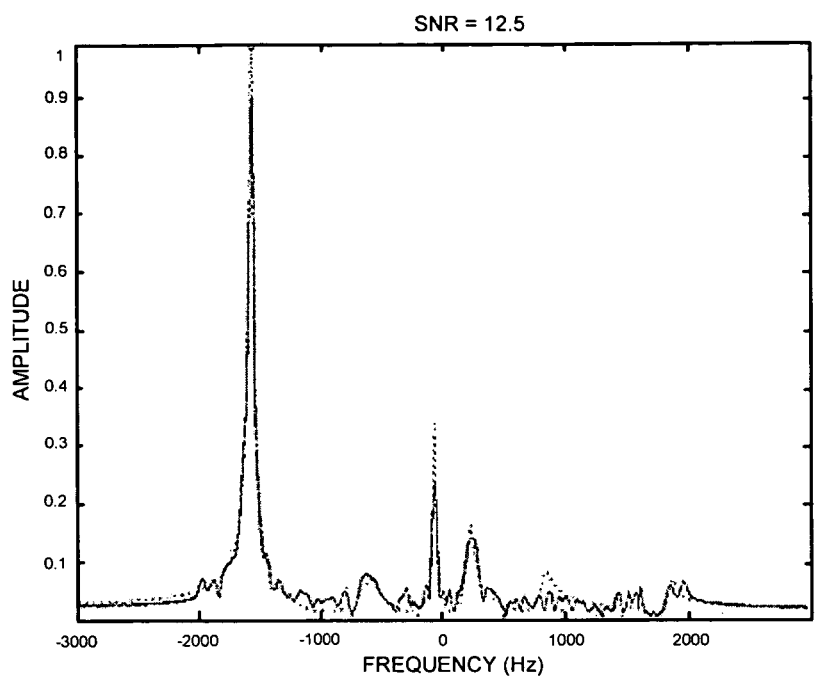
FIG. 7 shows the spectrum of FIG. 5 denoised utilizing a single TF transform in the $SLTF_{32}$ domain.

For purposes of further comparison, denoising the same signal using the hard thresholding technique in the $SLTF_{16}$, $SLTF_{32}$, and $SLTF_{64}$ domains (each one alone) gives an SNR equal to 12.2 dB, 12.5 dB and 13.3 dB, respectively. The spectrum of the enhanced signal using $SLTF_{32}$ is shown in FIG. 7.

Figure 9:
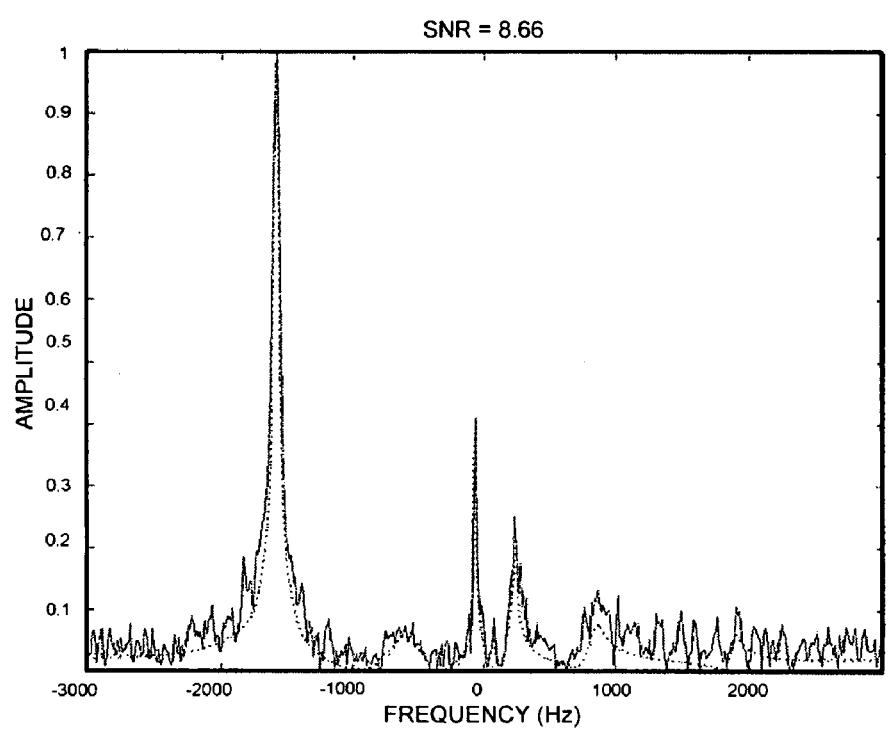
FIG. 9 shows the spectrum of FIG. 5 denoised utilizing wavelet analysis.

Comparing the results with the wavelet methodology, various wavelets were tested at various levels, using various thresholding techniques and with various threshold selection rules. The 8 level "dmey" (discrete approximation of Meyer wavelets) with soft thresholding and adaptive threshold levels determined using the "principle of Stein's Unbiased Risk Estimate" gave the best result. The resulting spectrum of these settings is shown in FIG. 9.

The method may be carried out by a software program stored on a computer readable medium and executing in main memory of a general purpose computer under direction of the microprocessor, or may be carried out by a microcontroller, a digital signal processor circuit, or an Application Specific Integrated Circuit (ASIC) programmed or configured for the purpose of carrying out the method.

It is to be understood that the present invention is not limited to the embodiment described above, but encompasses any and all embodiments within the scope of the following claims.

I claim:

1. A method for removing noise from nuclear magnetic resonance signals and images, comprising the steps of:
   (a) estimating a noise variance associated with a nuclear magnetic resonance (NMR) signal;
   (b) sampling the nuclear magnetic resonance signal;
   (c) digitizing the nuclear magnetic resonance signal;
   (d) selecting a set of analysis sampling rates, each of the rates varying in the number of samples in frequency so that each element of the set has a compact signal representation for at least one component according to differing component relaxation times of the signal;
   (e) for each element of the set of sampling rates, performing a stable linear time-frequency (SLTF) transform in order to determine transform coefficients for the element;
   (f) for each element of the set of sampling rates, applying threshold criteria to the transform coefficients, setting coefficients below a noise threshold value equal to zero in order to denoise the coefficients;
   (g) for each element of the set of sampling rates, performing an inverse SLTF transform on the denoised coefficients in order to form a denoised signal; and
   (h) averaging the denoised SLTF transform signals to form a denoised nuclear magnetic resonance signal.

2. The method for removing noise as recited in claim 1, wherein step (a) further includes the steps of:
   obtaining the NMR signal over a time interval including an extended time interval greater than free induction decay times for components of the signal;
   calculating extended time interval powers of the signal at time increments within the extended time interval; and
   calculating the estimated noise variance, σ, in the extended time interval powers.

3. The method for removing noise as recited in claim 2, wherein step (f) further includes calculating a threshold value t, the threshold value t being proportional to the noise variance σ, so that t=cσ where c is a constant.

4. The method for removing noise as recited in claim 2, wherein step (f) further includes calculating a threshold value t, the threshold value t being $t=g\sigma\sqrt{2\log K}$, where 0<g<1, and K is an upper limit of a finite interval over which the SLTF transform is defined.

5. The method for removing noise according to claim 1, wherein step (e) comprises solving the equation:

$$a_{m,n} = \sum_{k=0}^{K-1} x(k)\gamma_m^*(k)c\sin(k,n)_N$$

for a finite extent (0≦k≦K) discrete signal x(k) for m=0, ..., M−1 and n=0, ..., N−1, where M and N are the number of analysis samples in time and frequency, respectively, $a_{m,n}$ are the transform coefficients, c sin(z) is a function which represents cos(z) for even m and sin(z) for odd m, and γ(k) is the biorthogonal function to the discrete Gaussian window function:

$$h(k) = \exp\left(-\frac{\pi}{2N^2}\left(k - \frac{N-1}{2}\right)^2\right)$$

for each element of the set.

6. The method for removing noise according to claim 5, wherein step (g) comprises solving the equation:

$$x(k) = \sum_{m=0}^{M-1}\sum_{n=0}^{N-1} a_{m,n}h(k-mN)c\sin\frac{\pi\left(k+\frac{1}{2}\right)\left(n+\frac{1}{2}\right)}{N}$$

for each element of the set.

7. The method for removing noise according to claim 1, wherein steps (a) through (h) are performed on a computer, at least steps (b), (c), and (e) through (h) being performed automatically by software operating on the computer without manual input.

8. A digital signal processor circuit configured for performing the method for removing noise according to claim 1.

9. An application specific integrated circuit configured for performing the method for removing noise according to claim 1.

10. A nuclear magnetic resonance signal processing circuit, comprising:
    (a) means for estimating a noise variance associated with a nuclear magnetic resonance (NMR) signal;
    (b) means for sampling the nuclear magnetic resonance signal;

(c) means for digitizing the nuclear magnetic resonance signal;

(d) means for selecting a set of analysis sampling rates, each of the rates varying in the number of samples in frequency so that each element of the set has a compact signal representation for at least one component according to differing component relaxation times of the signal;

(e) means for performing a stable linear time-frequency (SLTF) transform for each element of the set of sampling rates in order to determine transform coefficients for the element;

(f) means for applying threshold criteria to the transform coefficients and setting the coefficients below a noise threshold value equal to zero for each element of the set of sampling rates in order to denoise the coefficients;

(g) means for performing an inverse SLTF transform on the denoised coefficients for each element of the set of sampling rates in order to form a denoised signal; and (h) means for averaging the denoised SLTF transform signals to form a denoised nuclear magnetic resonance signal.

11. The nuclear magnetic resonance signal processing circuit according to claim 10, wherein said means for estimating a noise variance further comprises:

means for obtaining the NMR signal over a time interval including an extended time interval greater than free induction decay times for components of the signal;

means for calculating extended time interval powers of the signal at time increments within the extended time interval; and means for calculating the estimated noise variance, $\sigma$, in the extended time interval powers.

12. The nuclear magnetic resonance signal processing circuit according to claim 11, wherein said means for applying threshold criteria further comprises means for calculating a threshold value t, the threshold value t being proportional to the noise variance $\sigma$, so that $t=c\sigma$ where c is a constant.

13. The nuclear magnetic resonance signal processing circuit according to claim 11, wherein said means for applying threshold criteria further comprises means for calculating a threshold value t, the threshold value t being $t=g\sigma\sqrt{2\log K}$, where $0<g<1$, and K is an upper limit of a finite interval over which the SLTF transform is defined.

14. A computer software product that includes a medium readable by a processor, the medium having stored thereon a set of instructions for removing noise from a nuclear magnetic resonance signal, comprising:

(a) a first sequence of instructions which, when executed by the processor, causes said processor to estimate a noise variance associated with a nuclear magnetic resonance (NMR) signal;

(b) a second sequence of instructions which, when executed by the processor, causes said processor to sample the nuclear magnetic resonance signal;

(c) a third sequence of instructions which, when executed by the processor, causes said processor to digitize the nuclear magnetic resonance signal;

(d) a fourth sequence of instructions which, when executed by the processor, causes said processor to select a set of analysis sampling rates, each of the rates varying in the number of samples in frequency so that each element of the set has a compact signal representation for at least one component according to differing component relaxation times of the signal;

(e) a fifth sequence of instructions which, when executed by the processor, causes said processor to perform a stable linear time-frequency (SLTF) transform for each element of the set of sampling rates in order to determine transform coefficients for the element;

(f) a sixth sequence of instructions which, when executed by the processor, causes said processor to apply threshold criteria to the transform coefficients for each element of the set of sampling rates, setting coefficients below a noise threshold value equal to zero in order to denoise the coefficients;

(g) a seventh sequence of instructions which, when executed by the processor, causes said processor to perform an inverse SLTF transform on the denoised coefficients for each element of the set of sampling rates in order to form a denoised signal; and (h) an eighth sequence of instructions which, when executed by the processor, causes said processor to average the denoised SLTF transform signals to form a denoised nuclear magnetic resonance signal.

15. The computer software product according to claim 14, wherein said first set of instructions further comprises:

a ninth sequence of instructions which, when executed by the processor, causes said processor to obtain the NMR signal over a time interval including an extended time interval greater than free induction decay times for components of the signal;

a tenth sequence of instructions which, when executed by the processor, causes said processor to calculate extended time interval powers of the signal at time increments within the extended time interval; and an eleventh sequence of instructions which, when executed by the processor, causes said processor to calculate the estimated noise variance, $\sigma$, in the extended time interval powers.

16. The computer software product according to claim 15, wherein said sixth set of instructions further comprises a twelfth sequence of instructions which, when executed by the processor, causes said processor to calculate a threshold value t, the threshold value t being proportional to the noise variance $\sigma$, so that $t=c\sigma$ where c is a constant.

17. The computer software product according to claim 15, wherein said sixth set of instructions further comprises a twelfth sequence of instructions which, when executed by the processor, causes said processor to calculate a threshold value t, the threshold value t being $t=g\sigma\sqrt{2\log K}$, where $0<g<1$, and K is an upper limit of a finite interval over which the SLTF transform is defined.

* * * * *

UNITED STATES PATENT AND TRADEMARK OFFICE
CERTIFICATE OF CORRECTION

| | |
|---|---|
| PATENT NO. | : 7,253,627 B1 |
| APPLICATION NO. | : 11/488595 |
| DATED | : August 7, 2007 |
| INVENTOR(S) | : Osama Abdel-Wahhab Ahmed |

It is certified that error appears in the above-identified patent and that said Letters Patent is hereby corrected as shown below:

On the title page insert item [73]:

--[73] Assignee: KING FAHD UNIVERSITY OF PETROLEUM AND MINERALS, DHAHRAN, 31261 SAUDI ARABIA,--

Signed and Sealed this
Fifteenth Day of October, 2013

Teresa Stanek Rea
*Deputy Director of the United States Patent and Trademark Office*